United States Patent Office 3,539,559

Patented Nov. 10, 1970

3,539,559

REPROGRAPHIC COPYING COMPOSITION AND REPROGRAPHIC COPYING MATERIAL PREPARED THEREWITH

Hans Ruckert, Wiesbaden-Schierstein, Germany, assignor to Kalle Aktiengesellschaft, Wiesbaden-Biebrich, Germany No Drawing. Filed Mar. 10, 1967, Ser. No. 622,070
Claims priority, application Germany, Mar. 12, 1966, K 58,705, K 58,706, K 58,707
Int. Cl. C07d *109/00*
U.S. Cl. 260—240 26 Claims

ABSTRACT OF THE DISCLOSURE

The present invention relates to a reprographic copying composition and a reprographic copying material prepared therewith, the copying composition containing a resin which is insoluble in water but soluble in organic solvents and soluble or swellable in alkaline aqueous solutions, and a water-insoluble, light-sensitive azido styryl compound which corresponds to one of the following general Formulae I and II:

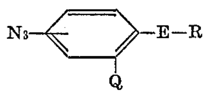

(I)

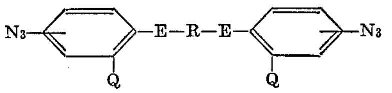

(II)

wherein:

E is one of the following ethylenically unsaturated groups:

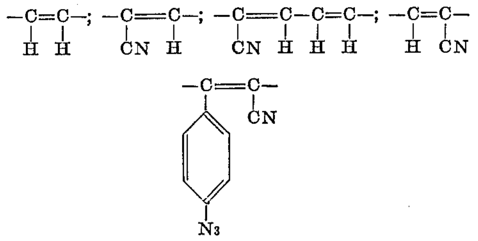

Q is hydrogen or other substituent,

R is an isocyclic aromatic or a heterocyclic aromatic group or a substituted isocyclic or heterocyclic aromatic group or a carbonyl group in the free acid form or in the form of an ester, amide, or nitrile, which is attached to the cyano methyl group of group E when E is

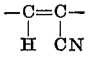

and the $N_3$-groups are in meta or para position to the group E.

Organic azido compounds, primarily aromatic azides, are among the light-sensitive compounds which are of practical interest in the graphic reproduction arts, particularly for reproduction by means of printing forms, e.g., for planographic or intaglio or relief printing. In a number of patent specifications, e.g., in German Pat. Nos. 752,852, and 929,460, processes are described in which reproduction layers are used having aromatic azido compounds as the light-sensitive substances, frequently in combination with synthetic or natural substances which undergo hardening under certain conditions.

In some of the known processes, the aromatic azides are employed in water-soluble form, which requires the presence of water-soluble groups in the molecule of the azido compound used. In other processes, the aromatic azides are used in organic solvent solutions. When a layer containing an aromatic azide is exposed to actinic light, the azide is converted by the action of light. The light-conversion products are distinguished from the unexposed azido compound by a change of color and, in the presence of hardenable substances, by a hardening or tanning of such hardenable substances, which leads to a change in their solubility characteristics. Reproduction layers containing aromatic azido compounds are negative-working. Upon image-wise exposure of the layer containing the azido compound under a transparent original, an image is obtained in the reproduction layer, which image is produced by the light-conversion products of the azido compound and has reversed tone values with respect to the original.

The use of aromatic azido compounds as effective substances in light-sensitive reproduction layers is of particular practical interest because of the formation of colored conversion products in such areas of the reproduction layer as have been affected by light.

The light-sensitive reproduction material of the invention consists of a support suitable for reprographic purposes and a reproduction layer of the above-described composition adhering thereto.

The aromatic groups represented by R in the above general Formulae I and II may be those which contain a mononuclear or condensed or uncondensed polynuclear ring system. The benzene ring, the naphthalene ring, the anthracene ring, the pyridine ring and the quinoline ring are exemplary. Hydroxyl, alkyl, alkoxy, dialkyl amino, nitro, halogen and azido groups are exemplary of the substituents Q in the general Formula I and II and the substituents which may be attached to the aromatic groups R.

The azido styryl compounds corresponding to the general Formulae I and II have not been described in the literature. They may be prepared by analogy to known processes.

Thus, the compounds corresponding to Formulae I and II in which the ethylenically unsaturated group E carries no cyano substituent may be obtained, e.g., in a smooth reaction from aromatic azido carbonyl compounds by means of a synthesizing carbonyl olefination according to Wittig, the so-called Wittig synthesis (see H. Krauch and W. Kunz "Namensreaktionen der Organischen Chemie," 2nd edition, 1962, pages 503 and 504, and "Organic Reactions," published by John Wiley & Co., New York, London, Sydney, vol. 14, 1965, pages 270 to 490, particularly 270 to 305). In this synthesis, triphenylphosphine methylene and its derivatives are used as activated methylene compounds which are reacted with carbonyl compounds, an ethylene being the result. The activated methylene compounds required for the carbonyl olefination can be obtained, e.g., by reaction of halogenated methyl compounds with triphenylphosphine. For the performance of a Wittig-synthesis for the purposes of the present invention, e.g., a solution of equimolecular quantities of an aromatic azido carbonyl compound and of a quaternary phosphonium salt capable of being converted into an active methylene compound is mixed, in absolute alcohol, with an excess of alkali alcoholate, and the mixture is then left standing at normal or slightly elevated temperature. The azido styryl compound precipitates as the reaction product. The yield may be even increased by adding water after the reaction is completed.

Alternatively, compounds corresponding to Formulae I and II may be obtained in a smooth reaction by the process known as "Knoevenagel-Condensation" (see H. Krauch and W. Kunz "Namensreaktionen der Organischen Chemie," 2nd edition, 1962, pages 260 and 261), in which compounds containing active methylene groups are condensed with aromatic or aliphatic aldehydes or ketones, amines being used as condensing agents in most cases. For instance, compounds corresponding to Formulae I and II above may be obtained by condensing 4-nitrobenzyl cyanide with benzaldehyde, naphthaldehyde, terephthalaldehyde, cinnamic aldehyde or some other aromatic aldehyde in ethanol to which a small quantity of piperidine has been added. The nitrostyryl compounds thus produced are catalytically reduced to form the corresponding amino compounds, these are diazotized, and the diazonium solutions thus obtained are then converted by means of sodium azide into the corresponding light-sensitive 4-azido styryl compounds.

It is also possible to produce the compounds directly, e.g., by condensing 4-azidobenzyl cyanide (melting point 61–63° C.) with the aromatic aldehydes.

Azido styryl compounds corresponding to Formulae I and II may be also obtained directly by a smooth reaction, e.g., by a Knoevenagel condensation, in which an aromatic carbonyl compound substituted by an azido group, such as azido benzaldehyde, azido naphthaldehyde, or azido cinnamic aldehyde, is reacted with a compound which contains an active methylene group. The compound containing the active methylene group is selected with regard to the azido styryl compound desired. For instance, isocyclic or heterocyclic aromatic compounds in which a cyano-substituted methyl group is directly attached to one of the carbon atoms of the aromatic nucleus may be used, or compounds in which a cyano-substituted methyl group is directly attached to the carbon atom of a carboxyl group which may be functionally modified, i.e., esterified, amidated or converted into the corresponding nitrile. Condensation may be performed, e.g., in warm ethanol, to which a small quantity of piperidine is added, and the styryl compounds which precipitate are of satisfactory purity.

The formulae of some exemplary azido styryl compounds employed in the reprographic copying composition and the copying material of the invention are listed below under consecutive numbers. Insofar as their melting or decomposition points and their absorption maxima, λ max., can not be taken from the following examples, they are listed below as follows:

| Formula Number | Melting point (° C.) | λ max., nm. |
|---|---|---|
| 2 | 156–157 | 367 |
| 3 | 92–93 | 351 |
| 5 | 103–104 | (1) |
| 10 | (1) | 323 |
| 13 | 170–173 | 353 |
| 14 | 150–151 | 352 |
| 15 | 184–185 | 392 |
| 17 | 165 | 330–360 |
| 23 | 77–79 | 337 |
| 26 | 68–69 | 344 |
| 27 | 77–78 | 344 |
| 30 | 175–176 | (1) |
| 34 | (1) | 398 |

1.
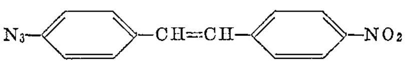

2.
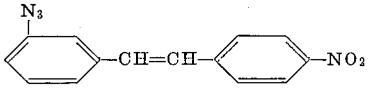

3.
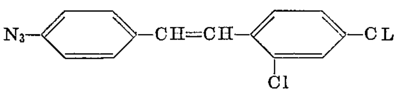

4.
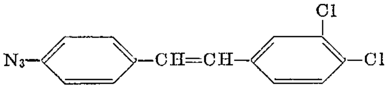

5.
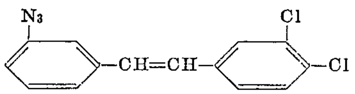

6.
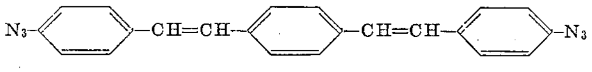

7.
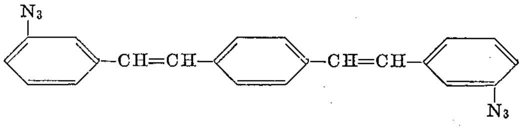

8.
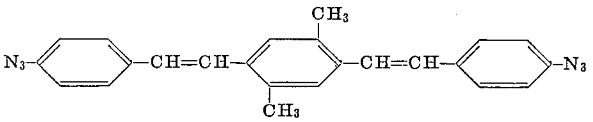

9.
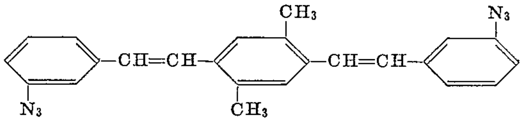

10.
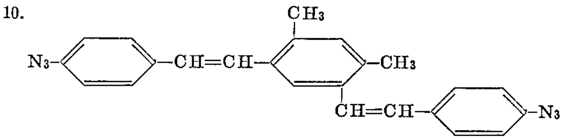

11.
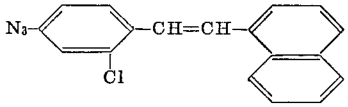

12.
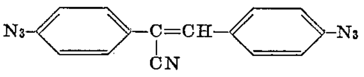

13.
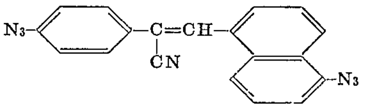

14.
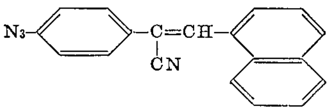

15.
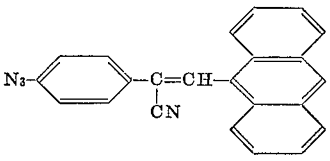

16.
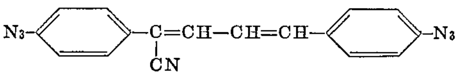

17.
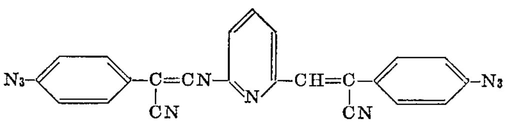

18.
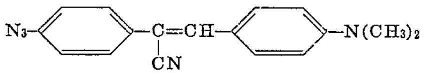

19.
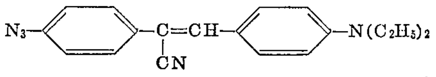

20.
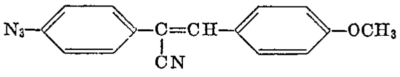

21.

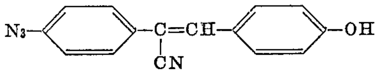

22.

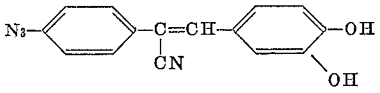

23.

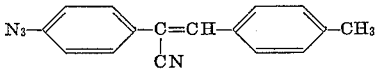

24.

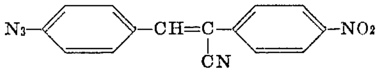

25.

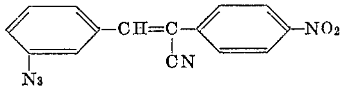

26.

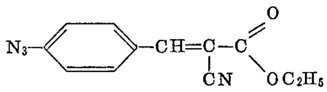

27.

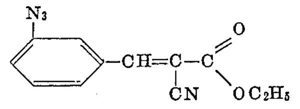

28.

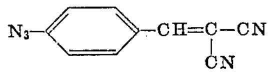

29.

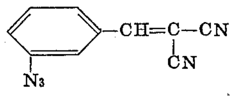

30.

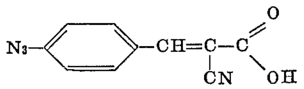

31.

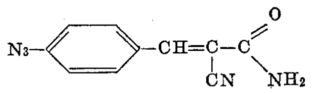

32.

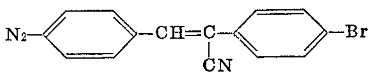

33.

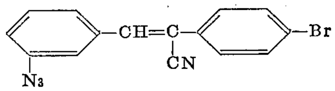

34.

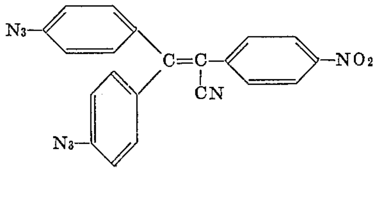

35.

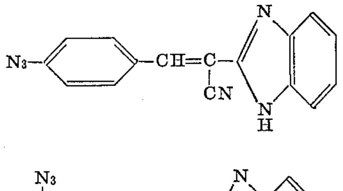

36.

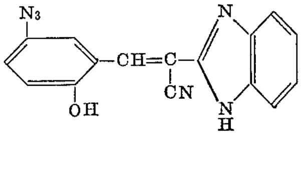

37.

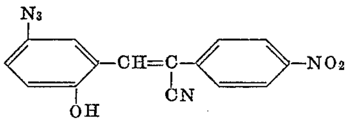

38.

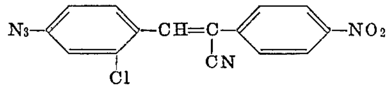

The light-sensitive copying compositions according to the present invention are prepared from one or more azido styryl compounds corresponding to Formulae I and II, if desired in admixture with azido styryl compounds of a different constitution or other negative-working light-sensitive substances, and resins which are soluble in organic solvents and soluble or swellable in an aqueous alkaline medium. Resins of this type are, e.g., copolymers of styrene and maleic anhydride, or copolymers of vinyl acetate and crotonic acid, polycondensates of the novolak type prepared from formaldehyde and phenols, or phenol-formaldehyde resins which have been modified by treatment with chloroacetic acid. Generally speaking, those resins are employed which are soluble at 20° C. to at least 3 percent by weight in glycolmonomethylether, glycol monoethylether, glycol monoethylether acetate, or dimethyl formamide, and which are soluble or swellable at 20° C. in a 3 percent aqueous sodium hydroxide solution to such an extent that a dry layer of the resin adhering to a mechanically roughened aluminum support can be wiped off the aluminum support by swabbing with a 3 percent aqueous sodium hydroxide solution.

In order to increase the film-forming capacity of the light-sensitive reproduction composition of the invention and to also improve its resistance to the etching solutions which may be used in one of the etching processes customary in some cases in chemigraphy, it may be advantageous to add other resins, i.e., resins which are not soluble and not swellable in aqueous alkaline solutions and which come under the designation "synthetic lacquer resins." Polyvinyl acetates, the copolymers thereof, and rubber resins have proved particularly suitable for this purpose. In some cases, it also may be advantageous to add a plasticizer. However, the total quantity by weight of resins which are not soluble or swellable in aqueous alkaline solutions and of plasticizer should not exceed the quantity of the resin which is soluble or swellable in aqueous alkaline solutions.

Depending upon the desired properties of the printing form and the appropriate developer used, the proportions of the azido styryl compound according to one of the general formula above, on the one hand, and the resins, including plasticizers, on the other hand, may vary within wide limits. Good results are achieved with proportions, by weight, ranging from 2:1 to 1:10, preferably from 1:1 to 1:5. Within the above limits, the proportions also are determined by the intended use of the light-sensitive reproduction material and by the properties of the developer provided for conversion of the reproduction material into a printing form.

For the preparation of the light-sensitive reproduction material of the invention comprising a support suitable for reprographic purposes and a layer adhering thereto of the light-sensitive reproduction composition according to the invention, the reproduction composition is dissolved in an organic solvent and applied to the support; the applied solution is then dried. Suitable solvents for the preparation of the coating solutions are, for example, esters, such as butyl acetate; ketones, such as methylisobutyl ketone and cyclohexanone; ethers, such as diisopropyl ether and dioxane; alcohols, such as n-butanol; diolethers, such as glycol monoethylether; and acid amides, such as dimethyl formamide, and mixtures of such solvents.

The support consists of a plastic film or paper or optionally of pretreated plates or foils of the metals usually employed for printing forms, such as zinc, magnesium, aluminum, chromium, brass, steel, as well as bimetal and trimetal plates, and it is coated with the solution of the reproduction composition of the invention by one of the customary coating techniques, e.g., by whirl-coating, spraying, immersion, roller application, or by applying a film of a liquid.

The reproduction composition may be colored or the reproduction layer may be colored after application to the support and drying. Using a colored layer is recommended in most cases, mainly because it facilitates the evaluation of the development and of the tone value obtained in the case of half-tones. If the printing plates prepared from the reproduction material are to be etched, dyestuffs preferably are selected with which the risk of a reductive discoloration in the etching bath is only small, e.g. dyestuffs of the phthalocyanine type and metal complex dyestuffs.

Processing of the reproduction material of the invention into a printing form, preferably a printing plate, is performed in the conventional manner. The material is exposed under an original to a light source emitting rays in the ultra-violet range of the spectrum, i.e., actinic rays. Whereas the resin component of the reproduction layer is cross-linked in the light-struck areas and thus hardened, the unexposed portions of the layer, which retain their solubility, are removed by immersion and/or swabbing with an organic solvent or, preferably, with an aqueous alkaline developer. The developer also may contain salts, e.g., halides, phosphates, silicates or sulfates or alkali and alkaline earth metals, or quaternary ammonium bases, e.g., reaction products of amines and ethylene oxide, as well as organic solvents, or mixtures thereof.

In some cases, particularly when masking and correcting work is to be done, it may be of advantage to render the layer more resistant by burning it in before the development or etching step. The light-sensitive reproduction layers of the invention are distinguished in that the burning-in operation can be performed not only after exposure to light and subsequent develoment, but also immediately after exposure and before development. By using a more concentrated developer of the above composition, the layer is removed, after burning-in, from the areas not struck by light during exposure, whereas the light-struck areas of the layer have become more resistant to the developer by the burning-in step.

Planographic printing plates produced from the light-sensitive reproduction material of the invention are inked up with greasy ink in the conventional manner after development. In the case of bimetal or trimetal plates or of relief and intaglio printing plates or cylinders, the layer-free areas of the printing forms are deep-etched by means of specific etching solutions, a protective medium for the side walls being added to the case of zinc and magnesium etching plates which are to be etched with nitric acid in one-step etching machines.

The light-sensitive reproduction composition of the invention and the light-sensitive reproduction material of the invention are distinguished by good light-sensitivity combined with good stability. The shelf-life of the reproduction material of the invention is exceptional. The reproduction material has the further advantage that the image is distinctly visible immediately after exposure to light. It thus combines the qualities always required, but by no means always present, of an ideal light-sensitive reproduction material, viz good adhesion between the support and the light-sensitive layer, good light sensitivity, good shelf-life, immediate visibility of the printing image after exposure to light, good affinity for greasy inks, and good mechanical resistance of the printing image and chemical resistance against attack during a potential etching process.

In the following examples, the relation between parts by weight and parts by volume is the same as that between grams and milliliters, nm. stands for nanometer, $$1\ \text{nm.}=1\ \text{m}\mu=10\ \text{A.}$$

EXAMPLE 1

1 part by weight of the compound of Formula 7 above, 1 part by weight of meta-cresol-formaldehyde novolak, 1 part by weight of a copolymer of styrene and maleic anhydride, and 0.1 part by weight of a dyestuff are dissolved in 100 parts by volume of dimethyl formamide. The copper surface of a support consisting of a plastic plate or film having a copper skin is coated with this solution and dried. The dried layer is exposed under a negative master of a circuit and the unexposed areas of the layer are removed from the support by wiping over with an approximately 15 percent trisodium phosphate solution. The bared copper is etched with a solution of iron-III-chloride or ammonium persulfate and a so-called reproduced circuit is obtained.

The compound of Formula 7 is prepared, by olefinization of carbonyl compounds, according to Wittig, from 2 moles of 3-azidobenzaldehyde and 1 mole of the bis-triphenyl - phosphonium chloride from 1,4 - bis-chloromethyl benzene. The equimolar quantities of the reaction constituents are dissolved in absolute ethanol and reacted with a solution of alkali alcoholate (sodium or lithium alcoholate) in an excess of absolute ethanol at normal or slightly elevated temperature. The solution first changes its color to green and then the yellow reaction product begins to separate. By leaving the solution and finally, after several hours, the addition of water up to a maximum of 40 percent of the total quantity of the solution, separation is completed. After suction, the new compound is recrystallized from dioxane. The decomposition point of the compound is 110 to 115° C. and λ max.=383 nm.

EXAMPLE 2

1 part by weight of the compound of Formula 8 above and 3 parts by weight of a meta-cresol-formaldehyde novolak are dissolved in 100 parts by volume of a mixture of glycol monoethylether and tetrahydrofuran (1:1). For the preparation of an offset printing plate for comparatively long runs, an aluminum plate having an electrolytically roughened surface is coated with the above-described solution and dried. The pre-coated light-sensitive plate is exposed to light under a negatice master and developed with a mixture consisting of 90 percent of a 15 percent aqueous trisodium phosphate solution and 10 percent of glycol monoethylether and made ready for printing by inking up with greasy ink.

The compound of Formula 8 is prepared from 2 moles of 4-azidobenzaldehyde and 1 mole of the bis-triphenyl-phosphonium chloride from 2,5-bis-chloromethyl - 1,4-xylene. Its melting point is 163 to 164° C. and its absorption maximum, λ max., is 377 nm.

EXAMPLE 3

1 part by weight of the compound of Formula 4 above, 1 part by weight of a meta-cresol-formaldehyde novolak, 1 part by weight of a copolymer resin of polyvinyl acetate and crotonic acid, and 0.2 part by weight of Zapon Fast Violet BE (Colour Index 12,196) are dissolved in 100 parts by volume of glycol monomethylether. A cleaned zinc plate is coated with this solution and dried. When using the material thus obtained, exposure is carried out under a negative master. The exposed layer is wiped over with a solution consisting of 85 percent of a 10 percent trisodium phosphate solution and 15 percent of glycol monomethylether, the unexposed areas being removed thereby. After exposure to light, the plate may first be burned-in, e.g., for 10 minutes at 180° C. In this case, it is treated with a developer consisting of 90 percent of a 2 percent sodium hydroxide solution and 10 percent of glycol monomethylether, in order to remove the unexposed areas. In every case, a positive image of the negative original which is resistant to etching is obtained on the zinc plate. By etching with nitric acid or by etching with the addition of protective media for the side walls, the developed zinc plate is processed into a relief printing plate in a one-step etching machine.

The compound of Formula 4 is prepared, by olefinization of carbonyl compounds, from 1 mole of 4-azidobenzaldehyde and 1 mole of 3,4-dichlorobenzyl-triphenylphosphonium chloride in ethanol with sodium alcoholate. Its melting point is 113 to 115° C. and its absorption maximum, λ max. is 331 nm.

EXAMPLE 4

1 part by weight of the compound of Formula 9 above, 1 part by weight of the condensation product of meta-cresol-formaldehyde novolak and chloroacetic acid, 1 part by weight of copolymer resin of polyvinyl acetate and crotonic acid, and 0.3 part by weight of the phthalocyanine dyestuff Zapon Fast Blue HFL (Colour Index 74,350) are dissolved in 100 parts by volume of dioxane. A bright, clean plate of refined steel is coated with this solution and dried. The sensitized steel plate is used for the photomechanical preparation of permanent writings. The plate is exposed to light under a positive master with writing thereon and then developed with a mixture consisting of 95 percent of a 10 percent trisodium phosphate solution and 5 percent of isopropanol. In a bath containing an acid solution of salts or dilute acids as the electrolyte, the steel plate is deep-etched in the decoated areas corresponding to the image of the writing either by means of direct current (anodically) or electrolytically by means of alternating current and the image of the writing is thus fixed.

The compound of Formula 9 is prepared, by olefinization of carbonyl compounds, from 2 moles of 4-azidobenzaldehyde and 1 mole of the bis-triphenyl-phosphonium chloride from 2,5-bischloromethyl-1,4-xylene. Its melting point is 163 to 165° C. and its absorption maximum, λ max., is 268 nm.

EXAMPLE 5

A cleaned magnesium plate is coated with the light-sensitive solution described in Example 4 and dried. The sensitized plate is exposed to light under a negative master and the unexposed parts of the light-sensitive layer are removed with the developer described in Example 4. By acid etching of the magnesium in the bared areas, by means of the one-step etching baths known for this purpose, a positive magnesium printing plate is obtained for relief printing.

EXAMPLE 6

1 part by weight of the compound of Formula 1 above, 1 part by weight of the compound of Formula 6 above, 1 part by weight of the condensation product of meta-cresol-formaldehyde novolak and chloroacetic acid, and 2 parts by weight of a copolymer of styrene and maleic anhydride are dissolved in 100 parts by volume of a mixture of glycol monoethylether and dimethyl formamide (1:1). A mechanically roughened aluminum foil is coated with this reproduction composition and dried. The light-sensitive foil is exposed to light under a negative master. By development with a 10 percent trisodium phosphate solution, the coated layer is removed in the unexposed areas and the aluminum surface is bared. After inking up the developed foil with greasy ink, the planographic printing plate is ready for printing.

The compound of Formula 1 is prepared, by olefinization of carbonyl compounds, from 1 mole of 4-azidobenzaldehyde and 1 mole of 4-nitro-benzyltriphenylphosphonium chloride. Its melting point is 154 to 155° C. and its absorption maximum, λ max., is 374 nm.

The compound of Formula 6 is obtained analogously from 2 moles of 4-azido-benzaldehyde and 1 mole of the bis-triphenyl-phosphonium chloride from 1,4-bischloromethylbenzene. Its melting point is 108 to 110° C. and its absorption maximum, λ max., is 362 nm.

EXAMPLE 7

1 part by weight of the compound of Formula 11 above, 1 part by weight of a meta-cresol-formaldehyde novolak, and 0.2 part by weight of a dyestuff are dissolved in 100 parts by volume of a mixture of glycol monomethylether and dioxane (1:1). For the preparation of a positive printing plate for long runs, a trimetal plate consisting of aluminum, copper, and chromium is coated with this solution and dried and, after exposure to light under a positive master, developed with an approximately 10 percent trisodium phosphate solution. The chromium layer bared by development in the unexposed areas is dissolved away with one of the conventional etching media for use with chromium layers. The parts of the coating retained in the exposed areas of the original layer are then removed with glycol monomethylether. The image areas of the bared copper are inked up as usual by wiping over with greasy ink. The trimetal plate having a positive printing image of the positive master is thus ready for printing.

The compound of Formula 11 is prepared, by olefinization of carbonyl compounds, from 1 mole of 2-chloro-4-azidobenzaldehyde and 1 mole of triphenyl-phosphonium chloride from 1-chloromethyl-naphthalene. The decomposition point of the compound is 149 to 150° C. The 2-chloro-4-azidobenzaldehyde (melting point 53 to 54° C.) is obtained from 2 - chloro-4 - nitro-toluene via the 2-chloro-4-amino-benzaldehyde by diazotization of the amine and reaction of the diazonium compound with sodium azide.

EXAMPLE 8

1 part by weight of the compound of Formula 12 above and 1 part by weight of meta-cresol-formaldehyde hyde novolak are dissolved in 100 parts by volume of glycol monoethylether. A mechanically roughened aluminum foil is whirl-coated with this solution and dried, at first by warm air and then for another 2 minutes at 100° C. The light-sensitive coated foil is processed into a positive planographic printing plate by exposure, under a negative master, to a light source emitting a large proportion of ultraviolet rays, e.g., a carbon arc lamp or a tubular exposure device, and development by wiping over with an aqueous approximately 15 percent trisodium phosphate solution. The aluminum printing plate is inked up with greasy ink and used for printing.

The compound of Formula 12 is prepared from 1 mole of 4-nitrobenzaldehyde and 1 mole of 4-nitrobenzylcyanide, by condensation according to Knoevenagel, i.e., reaction in hot ethanol as the solvent in the presence of a small quantity of piperidine or another secondary amine, catalytic reduction of the condensation product, tetrazotization and reaction with sodium azide. The melting point of the compound is 108 to 109° C. and its absorption maximum, λ max., is 355 nm.

EXAMPLE 9

2 parts by weight of the compound of Formula 18 above and 1 part by weight of meta-cresol-formaldehyde novolak are dissolved in 100 parts by volume of glycol ethylether acetate. A planographic printing plate of aluminum for offset printing is prepared with this solution according to the method described in Example 8. The developer used is an aqueous solution of a quaternary ammonium base obtained by reacting an aliphatic amine with ethylene oxide.

The compound of Formula 18 is prepared from 1 mole of 4-dimethylaminobenzaldehyde and 1 mole of 4-nitrobenzylcyanide, by condensation according to Knoevenagel, catalytic reduction of the nitro compound obtained, diazotization and reaction with sodium azide. Its melting point is 183° C. and its absorption maximum, λ max., is 412 nm.

EXAMPLE 10

1 part by weight of the compound of Formula 16 above, 1 part by weight of meta-cresol-formaldehyde novolak, 1 part by weight of a copolymer resin of polyvinyl acetate and crotonic acid, and 0.2 part by weight of the phthalocyanine dyestuff Zapon Fast Blue HFL (Colour Index 74,350) are dissolved in 100 parts by volume of glycol methylether acetate. A cleaned zinc plate is coated with this solution, dried and exposed to light under a negative master. After removal of the unexposed parts of the layer with a solution consisting of 90 percent of a 10 percent trisodium phosphate solution and 10 percent of glycol monoethylether, a positive image is obtained on the zinc plate. By etching with nitric acid or, preferably, by etching with nitric acid with the addition of a protective medium for the side walls, the zinc plate is processed into a relief printing plate in a one-step etching machine. In order to improve the adhesion of the image layer during the one-step etching process and during after-etching by hand for correcting the tone values, the plate may be burned-in at 100 to 200° C. after development and before etching. The plate also may be burned-in after exposure to light and before development, e.g., for 10 minutes at 180° C. In conneciton with this working method, development is carried out with development consisting of 90 percent of a 1.5 percent sodium hydroxide solution and 10 percent of isopropanol.

The compound of Formula 16 is prepared, by condensation according to Knoevenagel, from 1 mole of 4-nitrocinnamaldehyde and 1 mole of 4-nitrobenzylcyanide, catalytic reduction of the condensation product, tetrazotization and reaction with sodium azide. Its melting point is 127 to 128° C. and its absorption maximum, λ max., is 386 nm.

EXAMPLE 11

1 part by weight of the compound of Formula 22 above, 1 part by weight of meta-cresol-formaldehyde novolak, 1 part by weight of a copolymer of styrene and maleic anhydride, and 0.2 part by weight of Zapon Fast Blue HFL (Colour Index 74,350) are dissolved in 100 parts by volume of isopropanol. A trimetal plate consisting of aluminum, copper, and chromium is coated with this solution and the coated solution is dried. After exposure to light of the thus obtained layer under a positive master, development is carried out with a 10 percent aqueous solution of trisodium phosphate. By etching the chromium of the developed plate, subsequent removal of those parts of the coated layer struck by light during exposure (decoating) and inking up of the etched plate, the plate is made ready for printing, as a positive intaglio printing plate, in a conventional manner.

The compound of Formula 22 is prepared, by condensation according to Knoevenagel, from 1 mole of 3,4-dihydroxybenzaldehyde and 1 mole of 4-nitrobenzylcyanide The condensation is followed by catalytic reduction of the condensation product, diazotization of the amino compound and reaction of the diazonium compound with sodium azide. The melting point of the compound of Formula 22 is 164 to 165° C., and the absorption maximum, λ max., is 365 nm.

EXAMPLE 12

1 part by weight of the compound of Formula 20 above, 1 part by weight of meta-cresol-formaldehyde novolak, 1 part by weight of a copolymer resin of polyvinyl acetate and crotonic acid, and 0.2 part by weight of the phthalocyanine dyestuff Zapon Fast Blue HFL (Colour Index 74,350) are dissolved in 100 parts by volume of isopropanol and a clean plate of refined steel is coated with this solution. The steel plate coated in this manner is used for the photomechanical preparation of a permanent writing. For this purpose, the coated plate is exposed to light under a positive master with writing thereon and developed either with a mixture consisting of 95 percent of a 10 percent trisodium phosphate solution and 5 percent of isopropanol or first burned-in for 10 minutes at 180° C. and then developed with a mixture consisting of 90 percent of a 1.5 percent sodium hydroxide solution and 10 percent of methyl glycol. In a bath containing an acid solution of salts or dilute acids as the electrolyte, the image of the writing is deep-etched by means of direct current (anodically) or electrochemically by alternating current. Graphic intelligence is thus permanently fixed similarly as by means of engraving or embossing, but in a simpler manner.

The compound of Formula 20 is prepared, by condensation according to Knoevenagel, from 1 mole of 4-nitrobenzylcyanide and 1 mole of anise aldehyde. The condensation product is prepared by catalytic reduction, subsequent diazotization and reaction of the diazo compound with sodium azide. Its melting point is 102 to 103° C. and its absorption maximum, λ max., is 353 nm.

EXAMPLE 13

1 part by weight of the compound of Formula 16 above (the preparation thereof is described in Example 10), 1 part by weight of a condensation product of meta-cresol-formaldehyde novolak and monochloroacetic acid, 1 part by weight of a copolymer of styrene and maleic anhydride, and 0.2 part by weight of methyl violet are dissolved in 100 parts by volume of dimethyl formamide. A thoroughly cleaned copper plate is coated with this solution and the layer is dried. The layer is exposed to light under a positive screen original and developed with an approximately 10 percent trisodium phosphate solution. The bared areas of the copper plate corresponding directly to the positive image of the original are deep-etched in known manner with ferric chloride solution. A positive printing plate for halftone intaglio printing is thus obtained.

EXAMPLE 14

A plate of unglazed clay or porcelain or roughened glass is coated with a solution of 1 part by weight of the compound of Formula 19 above, 1 part by weight of a meta-cresol-formaldehyde novolak, and 1 part by weight of a copolymer of styrene and maleic anhydride in 100 parts by volume of dioxane, and the coated layer is dried. The layer is exposed to light under a negative master and the exposed layer is developed with an approximately 0.2 percent sodium hydroxide solution. An intensively brownish-yellow positive image of the original is thus obtained on the glass or ceramic support. The image may be strengthened, e.g., by coloring with pigment dyes, or burned-in or may be processed in another manner.

The compound of Formula 19 is prepared by condensation of 1 mole of 4-nitro-benzylcyanide and 1 mole of 4-diethyl-aminobenzaldehyde, catalytic reduction of the condensation product, diazotization of the amino compound obtained and reaction of the diazo solution with sodium azide. Its melting point is 182 to 183° C., and its absorption maximum, λ max., is 419 nm.

EXAMPLE 15

1 part by weight of the compound of Formula 21 above and 1 part by weight of a meta-cresol-formaldehyde novolak are dissolved in 100 parts by volume of glycol monomethylether. A paper film or a matte plastic film (cellulose acetate film for drawing purposes) is coated with this reproduction solution and the coated layer is dried. The reproduction material thus obtained is exposed to light under a master. The exposure image obtained is fixed by developing the exposed coating with an approximately 5 percent trisodium phosphate solution. When dyestuffs are added to the reproduction solution, images of a high covering capacity are obtained in different colors, which, on a transparent support, are also suitable as originals for the diazotype field.

The compound of Formula 21 is obtained by condensation of 1 mole of 4-nitrobenzylcyanide and 4-hydroxybenzaldehyde, catalytic reduction of the condensation product, diazotization of the amino compound obtained and subsequent reaction with sodium azide. Its melting point is 206 to 208° C.

EXAMPLE 16

1 part by weight of the compound of Formula 18 above (the preparation thereof is described in Example 9), 1 part by weight of the compound of Formula 1 above, 1 part by weight of meta-cresol-formaldehyde novolak, 1 part by weight of copolymer of styrene and maleic anhydride, 1 part by weight of a copolymer resin of polyvinyl acetate and crotonic acid, and 0.2 part by weight of Zapon fast Violet BE (Colour Index 12,196) are dissolved in a mixture of 50 parts by volume of glycol monoethylether and 50 parts by volume of dimethyl formamide. A cleaned and degreased zinc plate is coated with this solution and dried. The coating is exposed to light under a negative master. The unexposed parts of the layer are removed with a developer consisting of 85 percent of a 15 percent trisodium phosphate solution and 15 percent of glycol monomethylether. The image of the original on the zinc plate is positive and resistant to etching and is processed into a printing block by etching in an one-step etching machine.

If the plate is burned-in after exposure to light, e.g., for 10 minutes at 180° C., development is carried out with a solution consisting of 90 percent of a 2 percent sodium hydroxide solution and 10 percent of glycol monomethylether.

EXAMPLE 17

1 part by weight of the compound of Formula 25 above and 1 part by weight of a condensation product of meta-cresol-formaldehyde novolak and monochloroacetic acid are dissolved in 100 parts by volume of glycol monomethylether. For the preparation of a pre-sensitized reproduction material for the production of a positive printing plate for long runs, a trimetal plate consisting of aluminum, copper, and chrominum is coated with this solution on the chromium surface and the coated solution is dried. When being used, the reproduction material thus obtained is exposed to light under a positive master and then developed with a 5 percent trisodium phosphate solution. The chromium layer bared by development in the unexposed areas is dissolving away with one of the conventional etching media for the use with chromium layers so that the copper layer beneath is bared. The parts of the coating retained in the exposed areas of the original layer are removed with glycol monomethylether. The image areas of the bared copper are inked up in the usual manner by wiping over with greasy ink. The trimetal plate having a positive printing image thus may be used for printing.

The compound of Formula 25 is prepared from 1 mole of 3-azidobenzaldehyde and 1 mole of 4-nitrobenzylcyanide by condensation according to Knoevenagel, i.e., by reaction in hot ethanol as the solvent in the presence of small quantities of piperidine or another secondary amine. Its melting point is 170 to 173° C. and its absorption maximum, λ max., is 353 nm.

EXAMPLE 18

2 parts by weight of the compound of Formula 35 above, 2 parts by weight of meta-cresol-formaldehyde novolak, 2 parts by weight of the resin obtained by condensing the above novolak and monochloroacetic acid, 2 parts by weight of polyvinyl acetate resin, and 0.5 part by weight of Zapon Fast Violet BE (Colour Index 12,196) are dissolved in 100 parts by volume of dioxane. A zinc plate is coated with this solution and the coated layer is dried. After exposing the layer to light under a negative master, development is carried out either immediately thereafter with a developer consisting of 95 percent of a 10 percent trisodium phosphate solution and 5 percent of glycol monomethylether, or after burning-in for 10 minutes at 180° C. with a developer consisting of 90 percent of a 2 percent sodium hydroxide solution and 10 percent of glycol monomethylether and the plate is processed into a zinc block by means of the one-step etching process.

The compound of Formula 35 is prepared by condensing 1 mole of 4-azidobenzaldehyde with 1 mole of 2-cyanomethylbenzimidazole. Its melting point is 165° C. and its absorption maximum, λ max., is 370 nm.

EXAMPLE 19

1 part by weight of the compound of Formula 29 above, 1 part by weight of a condensation product of meta-cresol-formaldehyde novolak and monochloroacetic acid, 1 part by weight of a copolymer of styrene and maleic anhydride, and 0.2 part by weight of methyl violet are dissolved in 100 parts by volume of glycol monomethylether. A copper plate or a copper cylinder is coated with this solution and dried.

The light-sensitive coated support thus obtained is exposed to light under a positive screen master and developed with a solvent mixture of 90 percent of glycol and 10 percent of triglycol. The unexposed and now bared areas of the copper support are deep-etched with ferric chloride solution in the conventional manner. A printing form for halftone intaglio printing is obtained.

The compound of Formula 29 is prepared by condensation of 1 mole of 3-azidobenzaldehyde and 1 mole of malonic dinitrile. The melting point of the compound is 158 to 159° C.

EXAMPLE 20

1 part by weight of the compound of Formula 37 above, 1 part by weight of a meta-cresol-formaldehyde novolak, and 1 part by weight of a copolymer of styrene and maleic anhydride are dissolved in 100 parts by volume of dimethyl formamide. An aluminum plate which has been coated with this solution and dried is exposed to light under a negative master and then developed with a 10 percent solution of trisodium phosphate and, after inking up with greasy ink, used as a positive planographic printing plate.

The compound of Formula 37 is prepared by condensation of 1 mole of 5-azidosalicylaldehyde and 1 mole of 4-nitrobenzylcyanide. Its melting point is 169° C., and its absorption maximum, λ max., is 380 nm.

EXAMPLE 21

1 part by weight of the compound of Formula 33 above, 1 part by weight of the resin obtained by condensation of meta-cresolformaldehyde novolak and monochloroacetic acid, 1 part by weight of a copolymer resin of polyvinyl acetate and crotonic acid, and 0.5 part by weight of Zapon Fast Violet BE (Colour Index 12,196) are dissolved in 100 parts by volume of glycol monoethylether. A degreased zinc plate which has been roughened by acidifying with dilute nitric acid is coated with this solution and the coated layer is dried. The plate is exposed to light under a master and processed into a zinc block in the conventional manner.

The developer used is a 10 percent aqueous trisodium phosphate solution or, when the layer has been burned-in, a mixture consisting of 90 percent of a 1 percent sodium hydroxide solution and 10 percent of glycol monoethylether.

The compound of Formula 33 is prepared by condensation of 1 mole of 3-azidobenzaldehyde and 1 mole of 4-bromobenzylcyanide. The melting point of the compound is 129 to 130° C. and its absorption maximum, λ max., is 318 nm.

EXAMPLE 22

2 parts by weight of the compound of Formula 31 above, 1 part by weight of a copolymer of styrene and maleic anhydride, and 1 part by weight of a resin obtained by condensation of a meta-cresolformaldehyde novolak with monochloroacetic acid are dissolved in 100 parts by volume of glycol monomethylether. A thoroughly cleaned glass plate is coated with this solution and the coated layer is dried. The layer is exposed to light under a positive master and developed with a solvent mixture of 85 percent of glycol and 15 percent of triglycol. The layer is removed from the glass support in those areas not struck by light, i.e., the areas corresponding to the image of the positive original. The glass is deep-etched in the bared areas with aqueous hydrofluoric acid and may be inked up after etching.

The compound of Formula 31 is prepared by condensation of 1 mole of 4-azidobenzaldehyde and 1 mole of cyano acetamide. Its melting point is 179 to 180° C. and its absorption maximum, λ max., is 335 nm.

EXAMPLE 23

A cleaned plate of refined steel is coated with the solution described in Example 17 and the coated layer is dried. The light sensitive layer is exposed to light under a positive master with writing thereon and developed with an alkaline developer, e.g., with aqueous trisodium phosphate solution. In a bath containing an acid solution of salts or dilute acids as the electrolyte, the image of the writing on the steel plate, i.e., the areas decoated by the developer, is deep-etched by means of direct current (anodically) or electrochemically by means of alternating current and thus permanently fixed.

EXAMPLE 24

1 part by weight of the compound of Formula 36 above, 1 part by weight of the compound of Formula 32 above, 2 parts by weight of a condensation product of meta-cresol-formaldehyde novolak and mono-chloroacetic acid, 3 parts by weight of a copolymer of styrene and maleic anhydride, and 0.2 part by weight of Zapon Fast Blue HFL (Colour Index 74,350) are dissolved in 100 parts by volume of a mixture dimethyl formamide and dioxane (1:1). A support consisting of a plastic plate or film having a copper skin is coated with this solution. The layer coated onto the copper skin is dried and then exposed to light under a negative master of a circuit and the unexposed areas of the layer are removed by wiping over with an alkaline solution. The alkaline solution used as the developer for the exposed layer is a 10 percent aqueous solution of a quaternary ammonium base obtained by reacting an amine with ethylene oxide. The bared areas of the copper skin are etched with a solution of iron-III-chloride or ammonium persulfate and a so-called reproduced circuit is obtained.

The compound of Formula 36 is prepared by condensation of 1 mole of 5-azidosalicylaldehyde and 1 mole of 2-cyano-methylbenzimidazole. Its absorption maximum, λ max., is 390 nm.

The compound of Formula 32 is prepared by condensation of 1 mole of 4-azidobenzaldehyde and 1 mole of 4-bromobenzylcyanide. Its melting point is 104 to 105° C.

EXAMPLE 25

1 part by weight of the compound of Formula 38 above and 1 part by weight of a meta-cresol-formaldehyde novolak are dissolved in glycol monomethylether acetate. An electrolytically roughened aluminum foil is coated with this solution and the coated layer is dried; the layer thus obtained is exposed to light under a negative master. Those areas of the layer not struck by light and thus not cross-linked, are removed by wiping over with a 15 percent trisodium phosphate solution. The developed foil is inked up with greasy ink and used for printing as a positive planographic printing plate.

The compound of Formula 38 is prepared by condensation of 1 mole of 2-chloro-4-azidobenzaldehyde (melting point 53 to 54° C.) and 1 mole of 4-nitrobenzylcyanide. Recrystallized from acetone, the compound fuses at 187° C.

EXAMPLE 26

1 part by weight of the compound of Formula 28 above, 1 part by weight of the compound of Formula 24 above, 1 part by weight of a meta-cresol-formaldehyde novolak, and 1 part by weight of a condensation product of the said novolak with monochloroacetic acid are dissolved in 10 parts by volume of tetrahydrofuran. A mechanically roughened aluminum plate is coated with this solution and the coated layer is dried. The layer is exposed to light under a negative master and then developed with a mixture consisting of 95 percent of a 10 percent trisodium phosphate solution and 5 percent of diethylene glycol monoethylether. After inking up the developed image areas with greasy ink, the aluminum foil thus produced is used as a positive planographic printing plate.

The compound of Formula 28 is prepared by analogy to the compound of Formula 29 (see Example 19) from 1 mole of 4-azidobenzaldehyde and 1 mole of malonic dinitrile. Its melting point is 152 to 153° C., and its absorption maximum, λ max., is 350 nm.

The compound of Formula 24 is prepared by analogy to the compound of Formula 25 (see Example 17) from 1 mole of 4-azidobenzaldehyde and 1 mole of 4-nitrobenzylcyanide. Its melting point is 175 to 176° C. and its absorption maximum, λ max., is 368 nm.

It will be obvious to those skilled in the art that many modifications may be made within the scope of the present invention without departing from the spirit thereof, and the invention includes all such modifications.

What is claimed is:

1. An azido styryl compound having one of the formulae

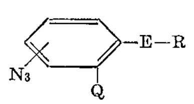

(I)

in which E is one of the ethylenically unsaturated groups:

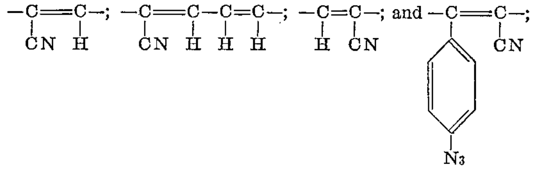

in which E is one of the ethylenically unsaturated groups:

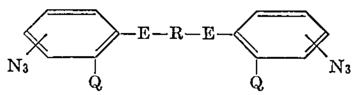

(II)

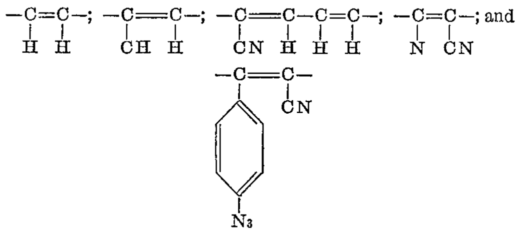

Q is selected from the group consisting of hydrogen, dialkyl amino, nitro, halogen and azido groups; R is selected from the group consisting of phenyl, phenylene, naphthyl, anthracenyl, azidophenyl, azidonaphthyl, and naphthimidazolyl groups, a carbonyl group in the form of a free acid, a lower alkyl ester, an amide, or a nitrile, which is attached to the cyano methyl group of E when the latter is

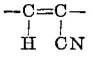

and the $N_3$ groups are in meta or para position to the group E.

2. An azido styryl compound having the formula

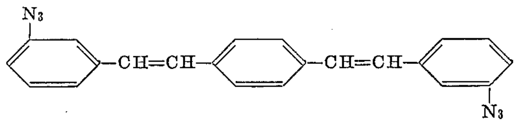

3. An azido styryl compound having the formula

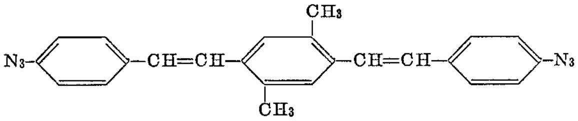

4. An azido styryl compound having the formula

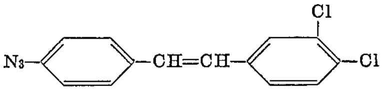

5. An azido styryl compound having the formula

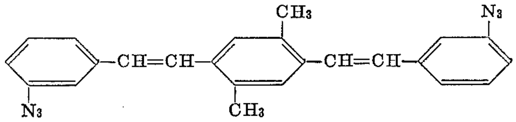

6. An azido styryl compound having the formula

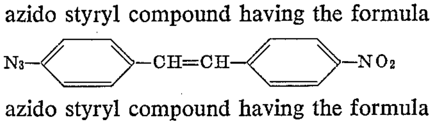

7. An azido styryl compound having the formula

8. An azido styryl compound having the formula

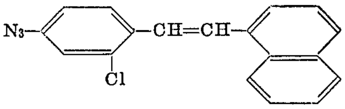

9. An azido styryl compound having the formula

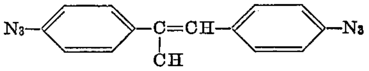

10. An azido styryl compound having the formula

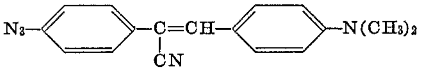

11. An azido styryl compound having the formula

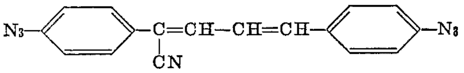

12. An azido styryl compound having the formula

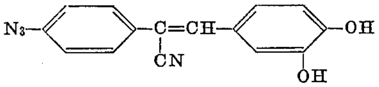

13. An azido styryl compound having the formula

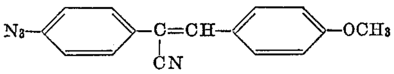

14. An azido styryl compound having the formula

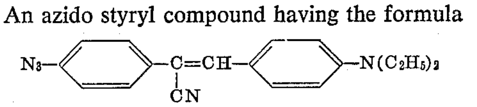

15. An azido styryl compound having the formula

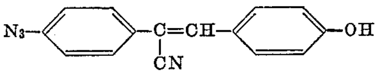

16. An azido styryl compound having the formula

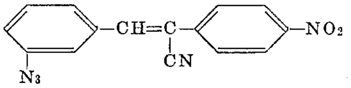

17. An azido styryl compound having the formula

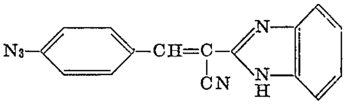

18. An azido styryl compound having the formula

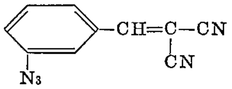

19. An azido styryl compound having the formula

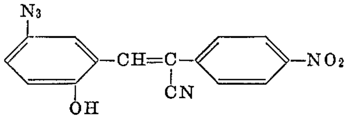

20. An azido styryl compound having the formula

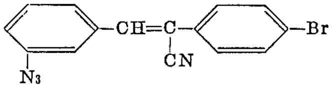

21. An azido styryl compound having the formula

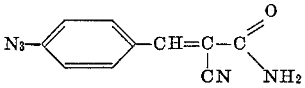

22. An azido styryl compound having the formula

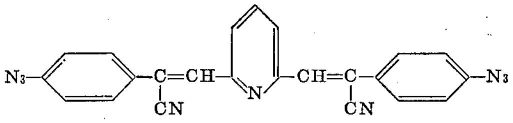

23. An azido styryl compound having the formula

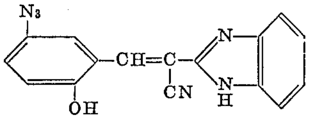

24. An azido styryl compound having the formula

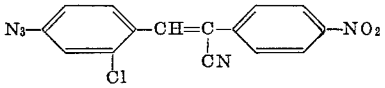

25. An azido styryl compound having the formula

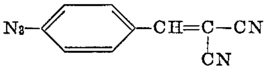

26. An azido styryl compound having the formula

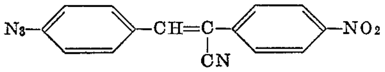

References Cited

UNITED STATES PATENTS

| | | | |
|---|---|---|---|
| 2,852,379 | 9/1958 | Hepher et al. | 96—91 |
| 3,321,309 | 5/1967 | Reichel | 96—36 |

JOHN D. RANDOLPH, Primary Examiner

U.S. Cl. X.R.

96—33, 36, 88; 260—141, 349

PO-1050
(5/69)

UNITED STATES PATENT OFFICE
CERTIFICATE OF CORRECTION

Patent No. 3,539,559 Dated November 10, 1970

Inventor(s) Hans Ruckert

It is certified that error appears in the above-identified patent and that said Letters Patent are hereby corrected as shown below:

Column 6, line 54, "formula" should be --- formulae ---.

Column 7, line 56, "to" should read --- in --- .

Column 8, line 46, "negatice" should read --- negative ---.

Column 11, line 25, "connecition" should read --- connection ---.

Column 13, line 45, "dissolving" should read --- dissolved ---.

Column 16, lines 45 to 50 should read: ---

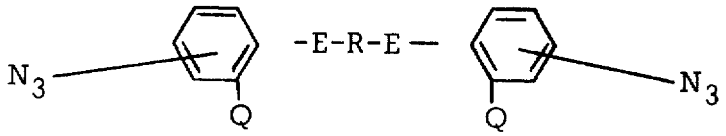

(II)

in which E is one of the ethylenically unsaturated groups: ---.

SIGNED AND
SEALED
FEB 2 1971

(SEAL)
Attest:

Edward M. Fletcher, Jr.
Attesting Officer

WILLIAM E. SCHUYLER, J
Commissioner of Paten